COMPONENT INSERTION MACHINE

Filed Dec. 31, 1964 5 Sheets-Sheet 1

INVENTORS
H. S. BUTTERWORTH
N. F. SMITH
BY J. J. Lipari
ATTORNEY

Dec. 13, 1966 H. S. BUTTERWORTH ETAL 3,291,359

COMPONENT INSERTION MACHINE

Filed Dec. 31, 1964 5 Sheets-Sheet 2

Dec. 13, 1966 H. S. BUTTERWORTH ETAL 3,291,359

COMPONENT INSERTION MACHINE

Filed Dec. 31, 1964 5 Sheets-Sheet 4

United States Patent Office 3,291,359
Patented Dec. 13, 1966

3,291,359
COMPONENT INSERTION MACHINE
Harry S. Butterworth, Beverly, and Norman F. Smith, Methuen, Mass., assignors to Western Electric Company, Incorporated, New York, N.Y., a corporation of New York
Filed Dec. 31, 1964, Ser. No. 422,825
6 Claims. (Cl. 227—155)

This invention relates to component insertion machines and more particularly to apparatus for bending and clinching component leads to printed wiring boards.

In the past, component insertion machines have included mechanisms operable to clinch component leads to a printed wiring board only in opposite directions, that is, after a pusher and former unit had inserted the leads of a component into holes in a printed wiring board, the ends of the leads which extended through the board were bent towards or away from each other. As the printing wiring board art developed, a need arose for finding a convenient technique for connecting external wires of certain components of a printed wiring board to an external circuit. It was discovered that a simple method of realizing this result was to have one of the leads of a component project beyond the edge of the printed wiring board. To accomplish this, it was necessary to bend one lead outwardly beyond the edge of the board. One method of doing this, while effecting positive clinching of the component leads to the board, was to bend both component leads simultaneously in the same direction, hereinafter referred to as in-line clinching.

However, since the occasions for using in-line clinching were infrequent in comparison to the conventional opposed clinching method, it was impractical to provide separate apparatus that could bend leads only in the in-line fashion.

An object of this invention is to provide an apparatus which is operable to bend and clinch component leads to a printed wiring board both in the opposed manner and in the in-line manner.

A further object of this invention is to provide an electro-pneumatic system to coordinate the movements of a pusher and former unit of a component insertion machine with an apparatus which is operable to bend and clinch component leads to a printed wiring board both in the opposed and in-line fashions.

Broadly, the invention comprises first and second bending elements, linkage means for moving the elements each in a predetermined direction into engagement with the respective leads of a component to bend each lead in respective predetermined directions, which may be opposite directions, and clinch them to a surface of a board. Means are provided for modifying the operation of the linkage means so that one of the elements is moved in a direction opposite to the predetermined direction to bend and clinch one lead of a component in the opposite direction while the other element bends and clinches the other lead in the predetermined direction.

The invention in one embodiment comprises pneumatic piston-cylinder means, two wiper rollers, and linkage means including two levers for transmitting the motion of the pneumatic means to the two rollers. For opposed clinching, the pneumatic means drives the linkage means such that the wiper rollers move toward each other to bend and clinch terminals of a component to a printed wiring board. For in-line clinching, the two levers are modified in a simple manner, so that upon actuation of the pneumatic means, the wiper rollers move in the same direction, bending and clinching the terminals of a component in the same direction. The movements of the bending and clinching mechanism are responsive, through an electro-pneumatic system, to the motion of the pusher and former unit of the component insertion machine of which it is a part.

These and other features, objects, and advantages of the invention will be understood more fully from a study of the following detailed description considered along with the accompanying drawings wherein.

Figure 8:
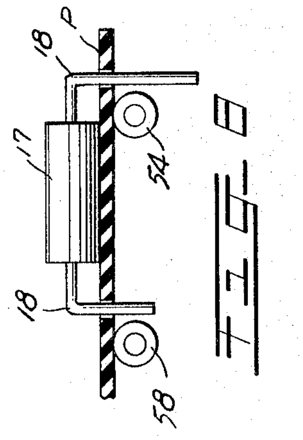
Figure 9:
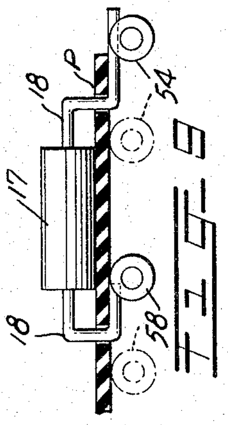
Figure 10:
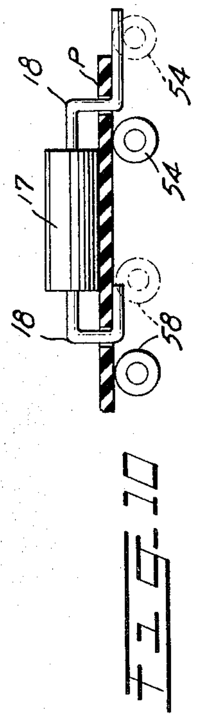
Figure 5:
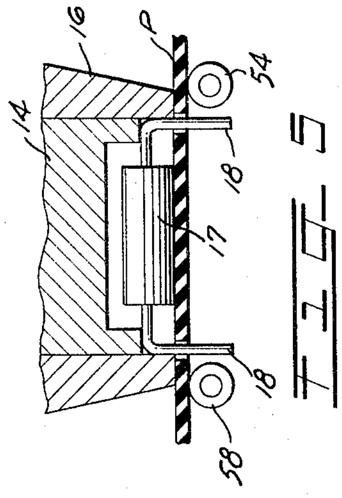
Figure 6:
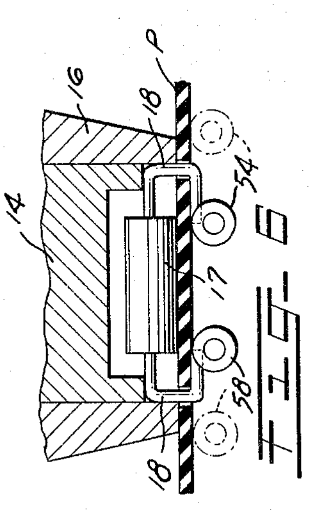
Figure 7:
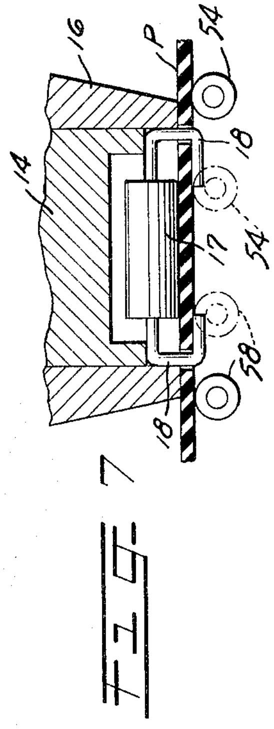

FIGS. 5, 6 and 7 disclose a portion of a printed wiring board illustrating three successive steps in the cycle of bending and clinching the leads of a component in the opposed fashion; and FIGS. 8, 9, and 10 disclose a portion of a printed wiring board illustrating three successive steps in the cycle of bending and clinching the leads of a component in the in-line fashion.

Figure 1:
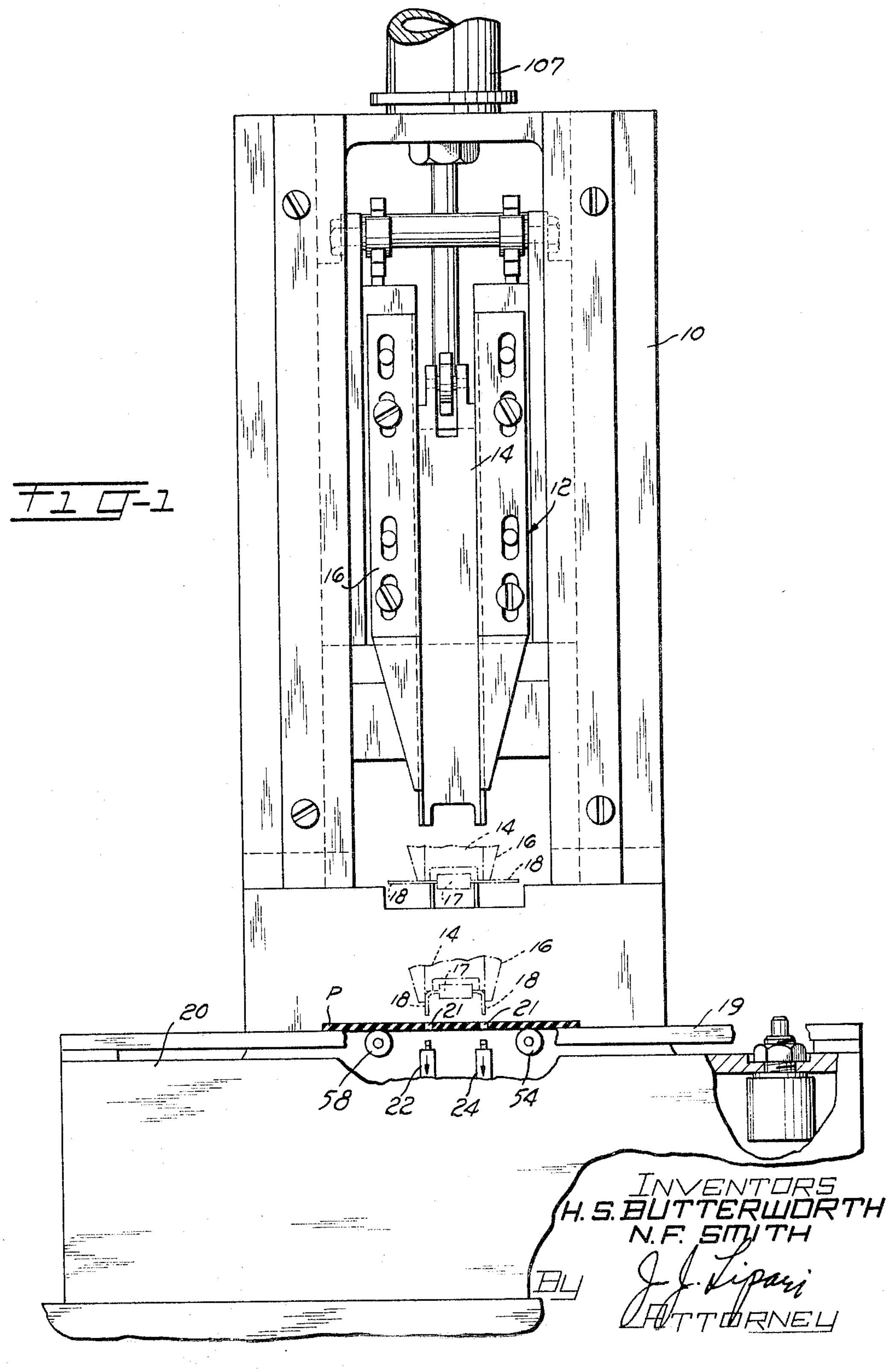
FIG. 1 is a front view of a portion of a component insertion machine showing the relative positions of the pusher-former unit during its component feeding cycle with a base unit which includes a schematic portion of the bending and clinching apparatus.

Referring now to FIG. 1 of the drawing, a housing 10 of a component insertion machine has included therein a pusher and former unit 12 comprising a pusher 14 and a former 16 which operate in a well known manner to pick up an electrical component 17 such as a diode from a supply source (not shown), shape the leads 18—18 thereof and carry it down to a top plate 19 of a base unit 20, upon which a printed wiring board P has been placed. It should be noted, however, that even though a diode is described herein it is merely illustrative since components having one or more leads in alignment, such as transistors also may be bent and clinched to a wiring board P. As seen in FIG. 1, the printed wiring board is placed upon top plate 19 in such a manner that two holes 21—21 in the printed wiring board into which the component leads are to be inserted, are received by two locating pins 22 and 24 which are mounted in base unit 20.

Mounted in the base unit 20, below top plate 19, is the apparatus for bending and clinching the leads of a component to the bottom side of the printed wiring board. The apparatus includes (FIG. 2) a fluid operated air cylinder 26 and a piston rod 28 connected thereto. Piston rod 28 is connected to an elongated bracket 30 which is movable in response to the reciprocatory motion of the piston rod. Two substantially T-shaped levers 32 and 34 are pivotally connected to the base unit by pivotal connections 36 and 38, respectively. The extremities of the leg portions of levers 32 and 34 are connected to bracket 30 by pivotal connections 40 and 42, respectively.

A supporting member 44 (FIG. 3) having a grooved track 46 therein is mounted in base unit 20 (FIG. 1) in spaced relationship with bracket 30. Two slidable blocks, 48 and 50, (FIG. 2) are positioned in track 46. Block 48, which is connected to lever 32 by a pivotal cam roll 52, supports thereon a bending roller 54. In a similar fashion, block 50, which is connected to lever 34 by a pivotal cam roll 56, supports thereon a bending roller 58.

Figure 3:
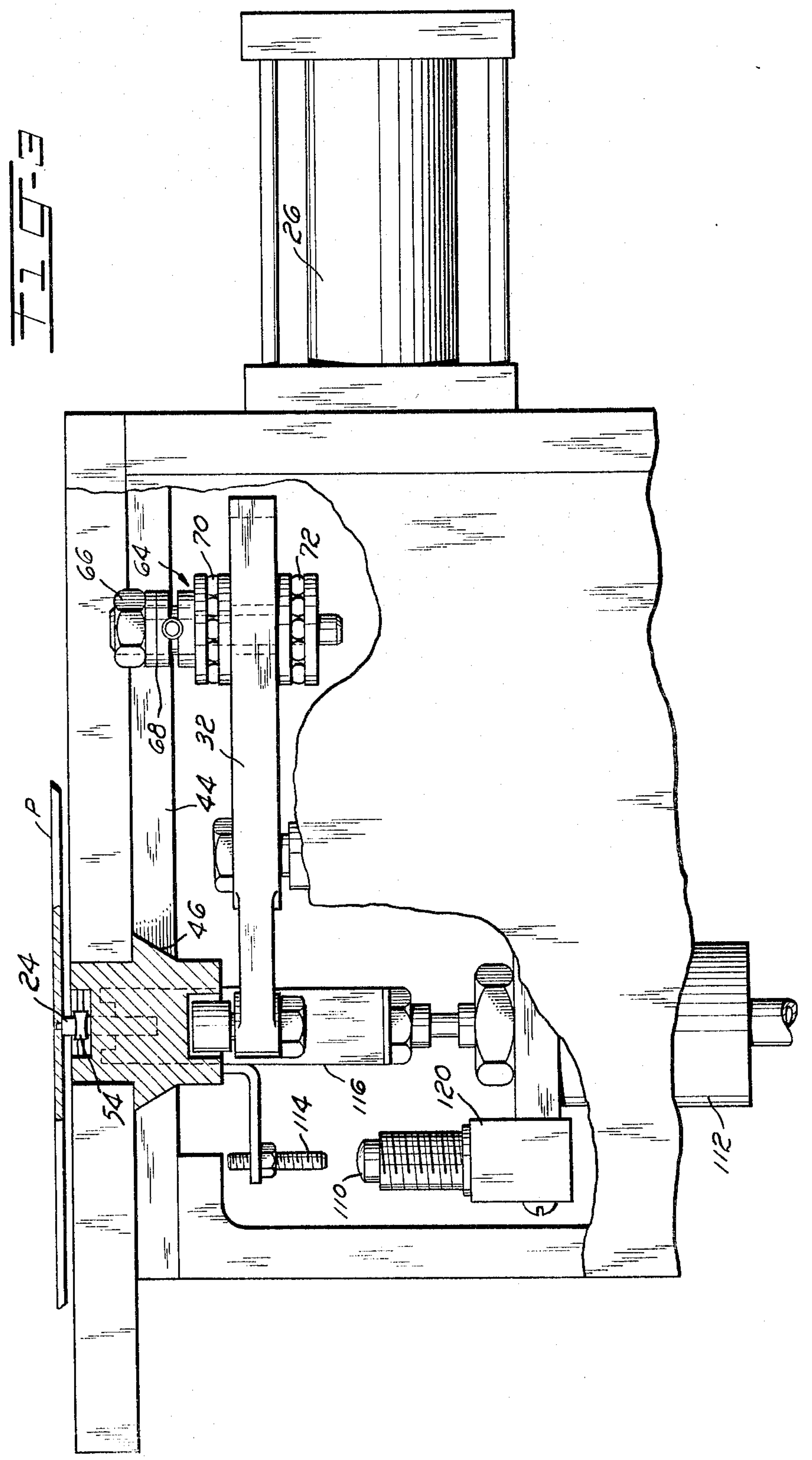
FIG. 3 is a side view of the base unit, partially in section, showing additional features of the operating mechanism.

A connecting rod 60 is pivotally connected to lever 34 at 62, is slidably received in lever 32 through an assembly 64. As seen in FIG. 3, assembly 64 comprises a nut 66, a split washer 68, and ball thrust bearings 70 and 72. With this structure, it is possible to adjust the assembly to provide both sliding motion of connecting rod 60 through split washer 68 and pivotal motion of lever 32 in base unit 20. By tightening nut 66, a rigid connection between connecting rod 60 and split washer 68 is attained while the pivotal connection of lever 32 to the base unit will be maintained.

A support member 74 is fixedly mounted to the base unit in parallel spaced relationship to bracket 30. Two shafts 76 and 78 are connected to bracket 30, as shown, and are slidable through holes 80 and 82, respectively, in support member 74. An actuating member 84 is connected to shaft 78 and extends parallel to support member 74 such that it faces an actuating button 86 of a switch 88 which is mounted on support member 74. Another switch 90 is mounted to the other side of support member 74 such that its actuating button 92 faces an actuating member 94 mounted on rod 76. Switches 88 and 90 are part of an electro-pneumatic system 96 (FIG. 4) which operates the component insertion machine and the bending and clinching apparatus thereof.

Figure 4:
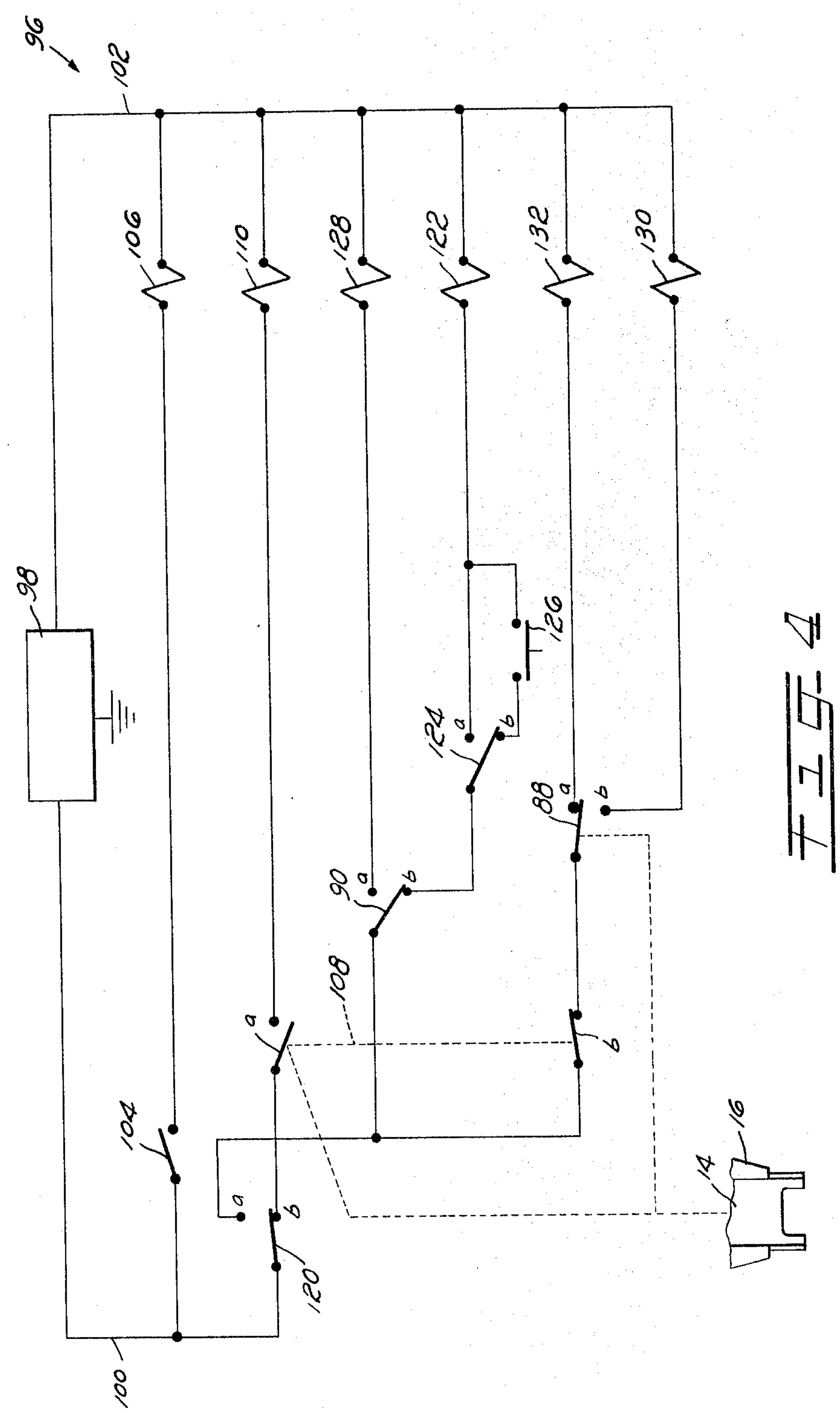
FIG. 4 is a schematic view of an electric circuit for the apparatus.

Now with reference to FIG. 4, the electro-pneumatic system 96 includes a power source 98 connected between lines 100 and 102. Upon a momentary depression of a foot pedal (not shown), a switch 104 closes to energize a solenoid 106 which actuates an air cylinder 107 to advance the pusher and former unit 12 downwardly within housing 10. During the downward stroke of the pusher and former unit 12, contact "*a*" of a double pole switch 108 is closed to energize a solenoid 110 to operate an air cylinder 112 (FIG. 3). The air cylinder 112 is operable to retract locating pins 22 and 24 from their position in top plate 9 and move them inwardly into base unit 20.

When the locating pins are fully retracted, an actuating member 114, attached to piston rod 116 of air cylinder 112, depresses an actuating button 118 of a switch 120, closing its contact "*a*" (FIG. 4). This will energize a solenoid 122 when pusher and former unit 12 completes its stroke, actuating a switch 124, mounted adjacent top plate 19, to close its contact "*a*." The energization of solenoid 122 activates air cylinder 26 to commence the bending and clinching cycle. An alternate path to solenoid 122, including a manually operated switch 126, is provided to assure that the solenoid 122 can be activated if the pusher and former unit fail to activate switch 124.

As the piston rod 28 of cylinder 26 is retracted, causing the bending rollers 54 and 58 to be fully advanced, actuating button 92 of switch 90 is engaged by actuating member 94, moving the switch to its contact "*a*" to energize a solenoid 128 which actuates air cylinder 107 to permit the return stroke of the pusher and former unit 12. As the pusher and former unit withdraws from top plate 19, switch 124 opens its contact "*a*" and closes its contact "*b*," following by switch 108 opening its contact "*a*" and closing its contact "*b*." This results in the energization of a solenoid 130 through contact "*b*" of switch 88 to operate air cylinder 26 to advance piston rod 28 thereby causing the bending rollers 54 and 58 to be retracted to their outermost position with respect to each other. When the bending rollers are fully retracted, actuating member 84 closes contact "*a*" of switch 88 to energize a solenoid 132 for operating air cylinder 112 to extend the locating pins 22 and 24 into top plate 19 ready to receive a printed wiring board. The operation of air cylinder 112 causes the retraction of actuating member 114 to open contact "*a*" and closed contact "*b*" of switch 120 to return the system to its starting position.

In operation, a printed wiring board is placed on top plate 19, the two holes of the board into which the leads 18—18 of a component 17 are to be inserted being received by locating pins 22 and 24. A foot pedal (not shown) is depressed by the operator, closing switch 104. This activates solenoid 106, which in turn energizes the air cylinder 107 which drives the pusher and former unit 12 downwardly with a component 17 held therein. When the pusher and former unit reach a predetermined point in their downward travel, they close contact "*a*" of switch 108 thereby activating solenoid 110 which operates air cylinder 112 to withdraw locating pins 22 and 24 from the printed wiring board.

When the piston rod 116 of air cylinder 112 reaches the lower limit of its travel, actuating member 114 strikes a button 118 of switch 120, closing its contact "*a*." When the former 16 reaches the bottom of its travel, it clamps the printed wiring board to top plate 19 while the pusher 14 inserts the leads 18—18 of the component into the holes just vacated by the locating pins. At this time, the pusher 14 strikes switch 124, to close its contact "*a*," thereby activating solenoid 122 which operates air cylinder 26. This initiates the bending-clinching cycle.

Figure 2:
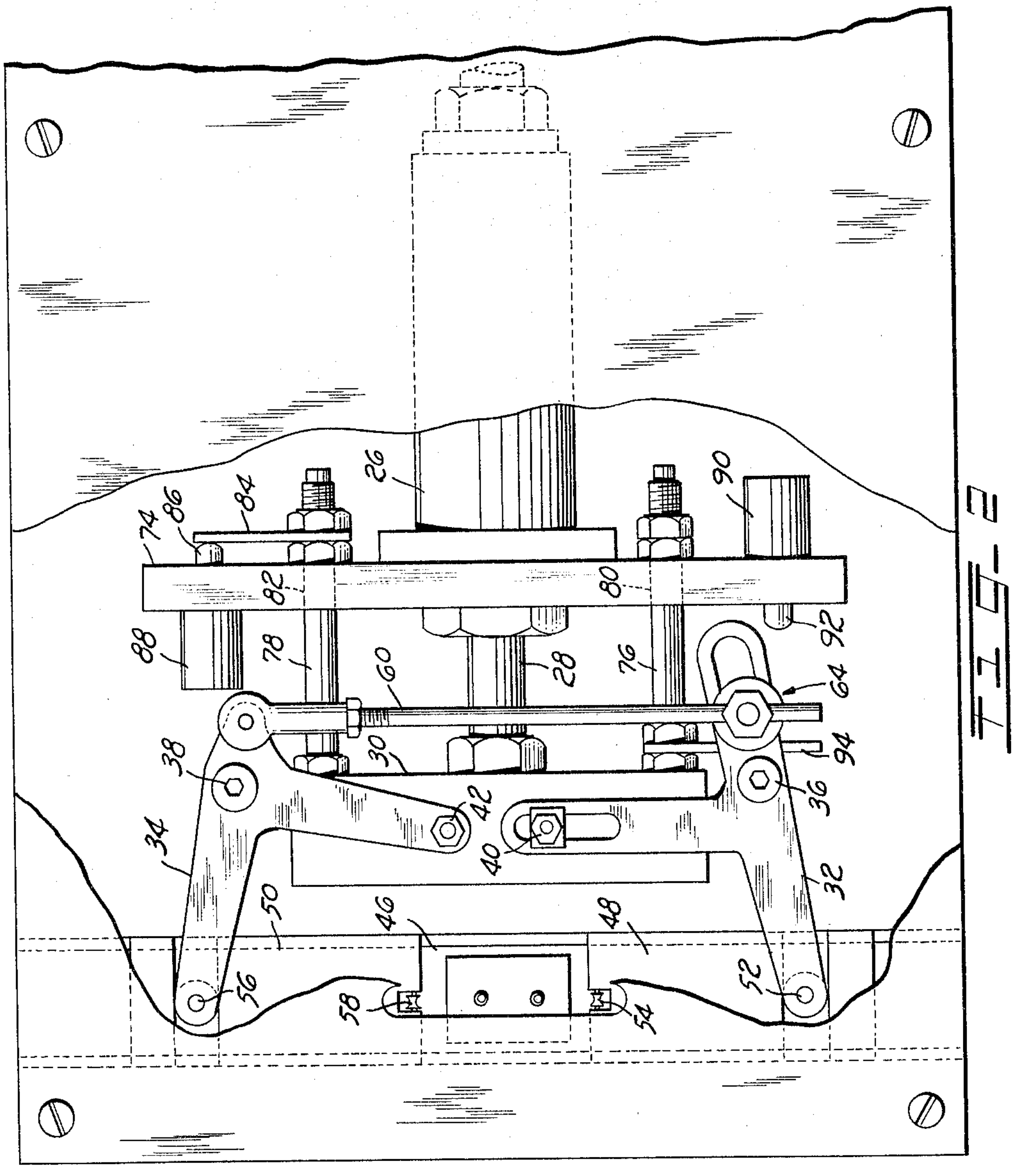
FIG. 2 is a plan view of the base unit with the top plate partially cut away to expose the operating mechanism of the bending and clinching apparatus.

For standard clinching, the bending and clinching apparatus is connected as shown in FIG. 2. Thus, when air cylinder 26 retracts piston rod 28, elongated bracket 30 will be drawn back therewith. This will cause levers 32 and 34 to pivot around pivotal connections 36 and 38 respectively, which will, in turn, move slidable blocks 48 and 50 towards each other. This results in bending rollers 54 and 58 striking and clinching the leads of the inserted component in the board in the opposed fashion, as shown sequentially in FIGS. 5–7.

To adapt the apparatus for in-line clinching, lever 32 is disconnected from bracket 30 by unscrewing the nut of the connection 40 between lever 32 and bracket 30. This will allow lever 32 to be rotated manually about pivotal connections 36 in a clockwise direction until roller 54, connected to block 48, is in its innermost position as shown in FIG. 8. Now the cross bars of levers 32 and 34 are substantially parallel to each other. Next, nut 66 of assembly 64 is tightened, thereby providing a rigid connection between connecting rod 60 and lever 32. With this arrangement, when piston rod 28 is retracted, lever 34 will be rotated in a counterclockwise direction in the same manner as previously described for the standard clinching operation. However, since lever 32 is no longer rigidly connected to bracket 30, it will not rotate in response to the movement thereof. Instead, due to the rigid connection between levers 32 and 34, through connecting rod 60, lever 32 will rotate in response to the movement of lever 34 and in the same direction as lever 34. Therefore, blocks 48 and 50, with their bending rollers 54 and 58, will be slid in the same direction. As a result, the component leads will be bent and clinched in the same direction, as illustrated in FIGS. 8 and 9, one of the leads 18—18 projecting beyond the printed board and adaptable for connection to an external component. It is to be noted that the bending rollers actually bend the components with a wiping action in both the in-line and opposed clinching operation.

When the bending rollers are in their fully advanced position, either for the opposed or in-line clinching operation, actuating member 94 strikes button 92 of switch 90, momentarily moving it from open contact "*b*" to its closed contact "*a*." This causes energization of air cylinder 107 to retract the pusher and former unit 12. As the pusher and former unit retracts, switches 108 and 124 are operated and their respective contacts "*a*" open while their respective contacts "*b*" close. The closing of contact "*b*" of switch 108 energizes solenoid 130 which, in turn, activates air cylinder 26, causing the bending rollers 54 and 58 to be retracted. When the bending rollers are fully retracted, switch 88 is activated by actuating member 84, to close its contact "*a*" thereby activating solenoid 132 to energize air cylinder 112 to raise the locating pins, actuating member 114 disengaging button 118 of switch 120 thereby causing its contact "*b*" to close and restore the system to its starting position.

It is to be understood that the above preferred embodiment is merely illustrative of the invention and the principles thereof are applicable to other arrangements that will fall within the spirit and scope thereof.

What is claimed is:

1. A component insertion machine for attaching components to printed wiring boards wherein the leads of the components extend through the boards comprising:
   - base means,
   - driving means mounted in said base means,
   - means including a track therein mounted in said base means,
   - first and second block means slidably mounted in said track, said first and second block means each including a roller thereon,
   - first and second lever means mounted to said base means in spaced relationship with each other, said first and second lever means each being connected to its respective first and second block means,
   - linkage means interconnecting said driving means with said first and second lever means and operable, upon activation of said driving means, to move the first and second block means each in a predetermined direction, the rollers thereon engaging the respective leads of a component to bend the leads in respective predetermined directions and clinch them to a surface of the printed wiring board, and
   - means for modifying the operation of the linkage means so that the first block means is moved in a direction opposite to the predetermined direction causing the roller thereon to bend and clinch one lead of a component in the said opposite direction while the roller on the second block means bends and clinches the other component lead in the predetermined direction.

2. A component insertion machine for attaching components to printed wiring boards wherein the leads of the components extend through the boards comprising:
   - base means,
   - drive means mounted in said base means,
   - means including a track therein mounted in said base means,
   - first and second block means slidably mounted in said track, each of said block means including a roller thereon,
   - first and second lever means mounted to said base means in spaced relationship with each other, said first and second lever means each being connected to its respective first and second block means,
   - a connecting rod pivotally connected to said first lever and slidably received in said second lever, and
   - linkage means interconnecting said drive means with said first and second lever means and operable, upon activation of said drive means, for rotating the first and second lever means about their respective connections to the base means to move said first and second block means toward each other to cause the rollers thereon to bend the component leads in their paths and clinch them to a surface of the printed wiring board.

3. A component insertion machine for attaching components to printed wiring boards wherein the leads of the components extend through the boards comprising:
   - base means,
   - drive means mounted in said base means,
   - means including a track therein mounted in said base means,
   - first and second block means mounted in said track, each block including a roller thereon,
   - first and second lever means mounted to said base means in spaced relationship with each other, said first and second lever means each being connected to its respective first and second block means,
   - a connecting rod pivotally connected to said first lever and rigidly affixed to said second lever, and
   - linkage means interconnecting said drive means with said first lever means and operable, upon activation of said drive means, to rotate said first lever means about its connection to the base which, in turn, simultaneously imparts movement through said connecting rod to rotate said second lever parallel to said first lever means to move said first and second block means in the same direction, causing the rollers thereon to bend the component leads in their paths and clinch them to a surface of the printed wiring board.

4. A component insertion machine for attaching components to printed wiring boards wherein the leads of the components extend through the boards comprising:
   - base means,
   - pneumatic means mounted in said base means,
   - means including a track therein mounted on said base means,
   - first and second block means slidably mounted in said track, said first and second block means each including a bending roller thereon,
   - first and second lever means mounted to said base means in spaced relationship with each other, said first and second lever means each being connected to its respective first and second block means,
   - a rod interconnecting said first and second lever means, said rod being pivotally mounted to said first lever means and adapted to be either slidably received in, or rigidly attached to, said second lever means, and
   - linkage means interconnecting said pneumatic means with said first and second lever means and operable, upon activation of said pneumatic means, to rotate said levers about their respective connections to the base means, which causes, in accordance with the desired connection of the connecting rod with the second lever means, either movement of the first and second block means toward each other, or in the same direction, causing the bending rollers thereon to bend the leads of the component and clinch them to the printed wiring board.

5. A component insertion machine for attaching components to printed wiring boards wherein the leads of the components extend through the boards comprising:
   - a pair of clinching elements, each disposed in a plane laterally displaced from the axes of the component leads extending through the boards,
   - first and second rotatable levers connected to each of the clinching elements,
   - driving means connected to the levers and operable to rotate the levers, causing the clinching means connected thereto to be moved each in a predetermined direction from their position laterally displaced from the component leads to strike the component leads, bending the leads in respective predetermined directions and clinching them to a surface of a printed wiring board, and
   - an adjustable connection between the driving means and one of the levers such that the clinching element to which that lever is connected may be moved in a direction opposite to its predetermined direction.

6. A component insertion machine for attaching components to printed wiring boards wherein the leads of the components extend through the boards comprising:

a pair of bending elements, each normally disposed in a plane laterally displaced from the axes of the component leads extending through the board, linkage means connected to the bending elements for moving them towards each other to strike the component leads, bend the leads towards each other and clinch them to a surface of the printed wiring board, a detachable connection between the linkage means and one of said bending elements such that, upon detaching said connection, said one bending element may be transferred laterally with respect to the other bending element to an alternate normal position, and means for operatively connecting said detached bending element and said other bending element such that the linkage means is operable to move said bending elements in the same direction.

References Cited by the Examiner

UNITED STATES PATENTS

| | | | |
|---|---|---|---|
| 2,758,303 | 8/1956 | Dow et al. | 227—4 X |
| 2,903,698 | 9/1959 | Stolecki et al. | 227—90 |

GRANVILLE Y. CUSTER, Jr., *Primary Examiner.*